United States Patent
Furukawa et al.

(10) Patent No.: US 8,093,950 B2
(45) Date of Patent: Jan. 10, 2012

(54) POWER AMPLIFIER HAVING TRANSFORMER

(75) Inventors: Akihiko Furukawa, Tokyo (JP); Tsuyoshi Kawakami, Tokyo (JP); Yasuhiro Kagawa, Tokyo (JP); Satoshi Yamakawa, Tokyo (JP)

(73) Assignee: Renesas Electronics Corporation, Kanagawa (JP)

( * ) Notice: Subject to any disclaimer, the term of this patent is extended or adjusted under 35 U.S.C. 154(b) by 9 days.

(21) Appl. No.: 12/622,034

(22) Filed: Nov. 19, 2009

(65) Prior Publication Data

US 2010/0148872 A1  Jun. 17, 2010

(30) Foreign Application Priority Data

Dec. 16, 2008  (JP) ................. 2008-319833

(51) Int. Cl.
*H03F 3/45* (2006.01)
(52) U.S. Cl. ...................... 330/195; 330/252
(58) Field of Classification Search .......... 330/195, 330/252, 276; 333/24 R
See application file for complete search history.

(56) References Cited

U.S. PATENT DOCUMENTS 7,728,661 B2 *  6/2010  Bockelman et al. ............ 330/51
2006/0232355 A1  10/2006  Park et al.

FOREIGN PATENT DOCUMENTS

| JP | 2005-503679 T | 2/2005 |
| JP | 2006-295896 A | 10/2006 |
| WO | WO 02/31967 A2 | 4/2002 |

OTHER PUBLICATIONS

J. Kang et al., "A Single-Chip Linear CMOS Power Amplifier for 2.4 GHz WLAN," ISSCC (International Solid-State Circuits Conference) 2006, p. 208-209, 649.

* cited by examiner

*Primary Examiner* — Steven J Mottola
(74) *Attorney, Agent, or Firm* — McDermott Will & Emery LLP

(57) ABSTRACT

A power amplifier amplifying and compositing differential signals and capable of suppressing harmonics is provided. The power amplifier includes first amplifiers amplifying a first input signal and a second input signal, which are differential signals, a first coil receiving the first input signal and the second input signal amplified by the first amplifiers, a second coil magnetically coupled with the first coil and outputting a composite signal of the amplified first input signal and second input signal, a third coil magnetically coupled with the second coil, and a first capacitor coupled between both ends of the third coil, wherein one end of the first capacitor is coupled to a ground node.

5 Claims, 5 Drawing Sheets

POWER AMPLIFIER HAVING TRANSFORMER

CROSS-REFERENCE TO RELATED APPLICATION

The disclosure of Japanese Patent Application No. 2008-319833 filed on Dec. 16, 2008 including the specification, drawings and abstract is incorporated herein by reference in its entirety.

BACKGROUND OF THE INVENTION

The present invention relates to a power amplifier, in particular, to a power amplifier that amplifies and composites differential signals.

At a mobile phone terminal or wireless LAN terminal, it is necessary for a transmitter, that is, a power amplifier, to transmit power of 10 to 30 dBm at maximum. Recently, a technique is proposed, which composites differential signals amplified by a pair of transistors with a transformer using a silicon MOS type transistor (insulating gate field effect transistor) in a power amplifier having signal frequency of about 1 GHz to 6 GHz. Such a power amplifier is shown in FIG. 11.9.2 in Non-Patent Document 1 (Jongchan Kang, et. al. "A Single-Chip Linear CMOS Power Amplifier for 2.4 GHz WLAN" ISSCC (International Solid-State Circuits Conference) 2006, p 208-209, 649.), and hereinafter referred to as a transformer type power amplifier of one differential pair.

In the power amplifier described in Non-Patent Document 1, a primary coil (a coil is referred to as a slab in Non-Patent Document 1) and a secondary coil magnetically coupled with the primary coil are arranged in parallel with each other. The middle point of the primary coil is a terminal to which a power supply voltage is supplied and by coupling a capacitor to the middle point, it is possible to suppress second harmonics.

As a technique to make an attempt to further increase output more than the transformer type power amplifier of one differential pair, it is proposed to composite differential amplified signals from two or more pairs of transistors with a transformer. Such a power amplifier is described in Patent Document 1 (Published Japanese translation of PCT patent application No. 2005-503679) as a distributed circular geometry power amplifier and hereinafter referred to as a transformer type power amplifier of multiple differential pairs. In Patent Document 1, a configuration is disclosed, in which differential signals respectively amplified by four pairs of transistors are composited with the secondary coil of the transformer coupled in series.

As another technique to make an attempt to further improve efficiency more than the transformer type power amplifier of one differential pair described in Non-Patent Document 1, a configuration is disclosed in Patent Document 2 (Japanese Patent Laid-Open No. 2006-295896), in which the differential signals of two pairs of transistors are composited with a transformer where primary coils having different shapes are arranged on both sides of a secondary coil.

SUMMARY OF THE INVENTION

In Non-Patent Document 1, however, although the configuration to suppress the second harmonics is disclosed, the suppression of the third harmonics included in the output signal along with the second harmonics is not at all taken into consideration. Further, in Patent Document 1 and Patent Document 2, both the suppression of the second harmonics and the suppression of the third harmonics are not taken into consideration.

Accordingly, an object of the present invention is to provide a power amplifier amplifying and compositing differential signals and capable of suppressing harmonics.

In order to solve the above-mentioned problems, a power amplifier according to an aspect of the present invention comprises: a first amplifier amplifying a first input signal and a second input signal, which are differential signals; a first coil receiving the first input signal and the second input signal amplified by the first amplifier; a second coil magnetically coupled with the first coil and outputting a composite signal of the amplified first input signal and second input signal; a third coil magnetically coupled with the second coil; and a first capacitor coupled between both ends of the third coil, wherein one end of the first capacitor is coupled to a ground node.

According to the present invention, it is possible to amplify and composite differential signals and suppress harmonics.

DETAILED DESCRIPTION OF THE PREFERRED EMBODIMENTS

Figure 1:
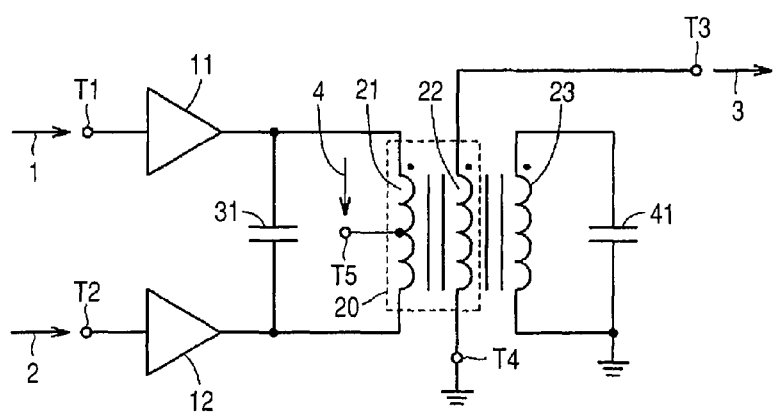
FIG. 1 is a diagram showing a configuration of a power amplifier according to a first embodiment of the present invention.

Embodiments of the present invention will be described below using the drawings. In the drawings, the same symbols are assigned to the same parts or corresponding parts and their description is not repeated.

First Embodiment

FIG. 1 is a diagram showing a configuration of a power amplifier according to a first embodiment of the present invention.

Referring to FIG. 1, a power amplifier 101 is a transformer type power amplifier of one differential pair, comprising amplifiers 11 and 12, a transformer 20, capacitors 31 and 41, a tertiary coil 23, and terminals T1 to T5. The transformer 20 includes a primary coil 21 and a secondary coil 22.

The amplifiers 11 and 12 amplify an input signal 1 and an input signal 2 received via the terminals T1 and T2, respectively. The input signal 1 and the input signal 2 are differential signals, for example, 180° different in phase from each other.

The transformer 20 composites the output signal of the amplifier 11 and the output signal of the amplifier 12. That is, the primary coil 21 has a first end that receives the input signal 1 amplified by the amplifier 11 and a second end that receives the input signal 2 amplified by the amplifier 12. To the middle point of the primary coil 21, the terminal T5 is coupled and to the terminal T5, a power supply voltage 4 is supplied.

The capacitor 31 is coupled between the first end and the second end of the primary coil 21. The primary coil 21 and the capacitor 31 constitute an output matching circuit of the amplifiers 11 and 12.

The secondary coil 22 is magnetically coupled with the primary coil 21 and outputs a composite signal 3 of the input signal 1 and the input signal 2 after amplified. In more detail, the secondary coil 22 has a first end coupled to the terminal T3 and a second end coupled to the terminal T4. The output signal 3 of the power amplifier 101, that is, the composite signal 3 of the input signal 1 and the input signal 2 after amplified is output from the terminal T3. The terminal T4 is coupled to a ground node to which a ground voltage is supplied.

The tertiary coil 23 is magnetically coupled with the secondary coil 22 and has a first end coupled to a first end of the capacitor 41 and a second end coupled to a second end of the capacitor 41 and a ground node to which a ground voltage is supplied.

Figure 2:
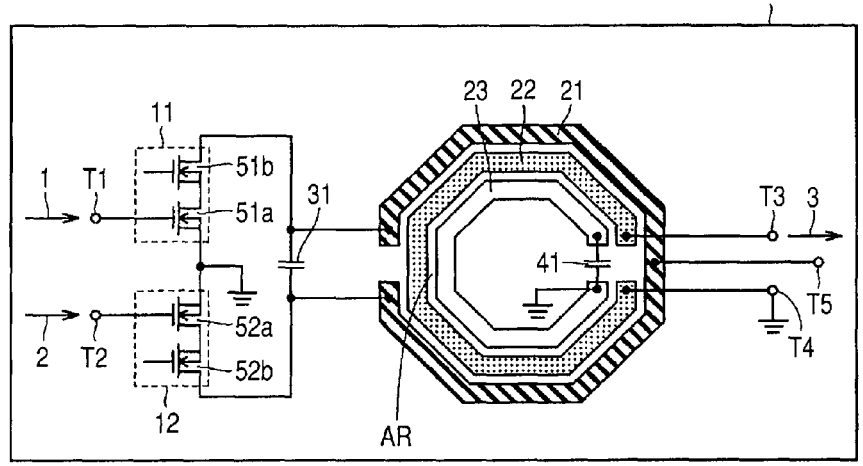
FIG. 2 is a diagram showing a schematic layout of each coil in the power amplifier according to the first embodiment of the present invention.

FIG. 2 is a diagram showing a schematic layout of each coil in the power amplifier according to the first embodiment of the present invention.

Referring to FIG. 2, the power amplifier 101 includes a semiconductor substrate B having a main surface over which the circuit shown in FIG. 1 is provided.

The primary coil 21, the secondary coil 22, and the tertiary coil 23 are formed over the same main surface of the semiconductor substrate B using wire layers and are substantially C-shaped. For example, the primary coil 21 is arranged at the outermost circumference, the secondary coil 22 is located inside the primary coil 21, and the tertiary coil 23 is located inside the secondary coil 22. The capacitor 41 is coupled between both ends of the tertiary coil. The capacitor 41 is located inside the secondary coil 22.

In more detail, the primary coil 21 is provided over the main surface of the semiconductor substrate B, extends in the circumferential direction, and is formed by a conductive line which is opened at a partial section in the circumferential direction.

The secondary coil 22 is provided over the main surface of the semiconductor substrate B, extends in the circumferential direction, and is formed by a conductive line which is opened at a partial section in the circumferential direction.

The primary coil 21 is disposed so as to surround the secondary coil 22. A configuration may be such that the secondary coil 22 is disposed so as to surround the primary coil 21.

The tertiary coil 23 is provided over the main surface of the semiconductor substrate B, extends in the circumferential direction, and is formed by a conductive line which is opened at a partial section in the circumferential direction is surrounded by the primary coil 21 and the secondary coil 22.

The amplifier 11 includes a circuit in which, for example, N-channel MOS type transistors 51a and 51b are cascode-coupled. The amplifier 12 includes a circuit in which, for example, N-channel MOS type transistors 52a and 52b are cascode-coupled.

In more detail, the N-channel MOS type transistor 51a has a drain, a source coupled to a ground node, and a gate that receives the input signal 1. The N-channel MOS type transistor 51b has a drain coupled to the first end of the primary coil 21, a source coupled to the drain of the N-channel MOS type transistor 51a, and a gate that receives a predetermined voltage. The N-channel MOS type transistor 52a has a drain, a source coupled to the ground node, and a gate that receives the input signal 2. The N-channel MOS type transistor 52b has a drain coupled to the second end of the primary coil 21, a source coupled to the drain of the N-channel MOS type transistor 52a, and a gate that receives a predetermined voltage.

Figure 3:
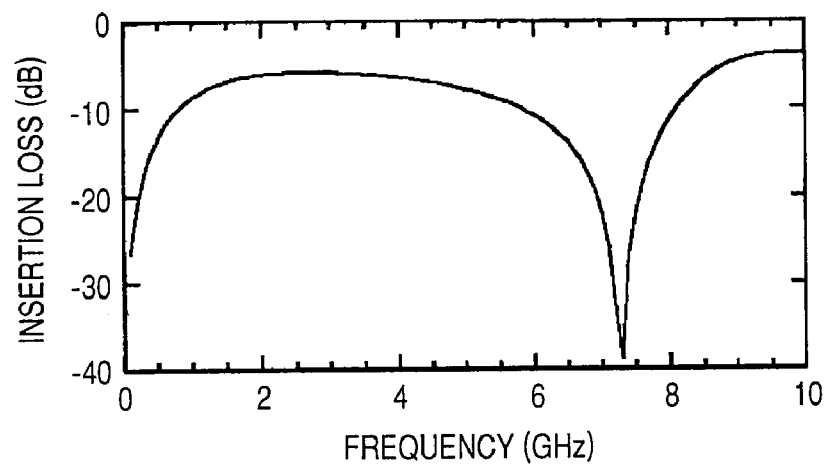
FIG. 3 is a diagram showing the calculation results of the insertion loss characteristics in a high frequency region of a circuit block including a transformer 20, a tertiary coil 23, and a capacitor 41 to be applied to the power amplifier according to the first embodiment of the present invention.

FIG. 3 is a diagram showing the calculation results of the insertion loss characteristics in a high frequency region of a circuit block including the transformer 20, the tertiary coil 23, and the capacitor 41 to be applied to the power amplifier according to the first embodiment of the present invention.

In the calculation of the insertion loss characteristics shown in FIG. 3, it is assumed that: the primary coil 21 is an ideal inductor and its L (inductance) value is 2.4 nH; the secondary coil 22 is an ideal inductor and its L value is 2.2 nH; and the tertiary coil 23 is an ideal inductor and its L value is 2.0 nH. It is also assumed that: the magnetic coupling coefficient k value between the primary coil and the secondary coil is 0.565 and the magnetic coupling coefficient k value between the secondary coil and the tertiary coil is 0.565; and the capacitor 41 is an ideal capacitor and its C (capacitance) value is 0.24 pF.

Referring to FIG. 3, when the frequency of the output signal of the power amplifier 101 is 2.4 GHz, an insertion loss of 40 dB is obtained at a frequency of 7.2 GHz, three times the frequency of the output signal. That is, it can be seen that the circuit block including the transformer 20, the tertiary coil 23, and the capacitor 41 has a function to suppress the frequency component of three times the frequency of the output signal, that is, 2.4 GHz.

Figure 4:
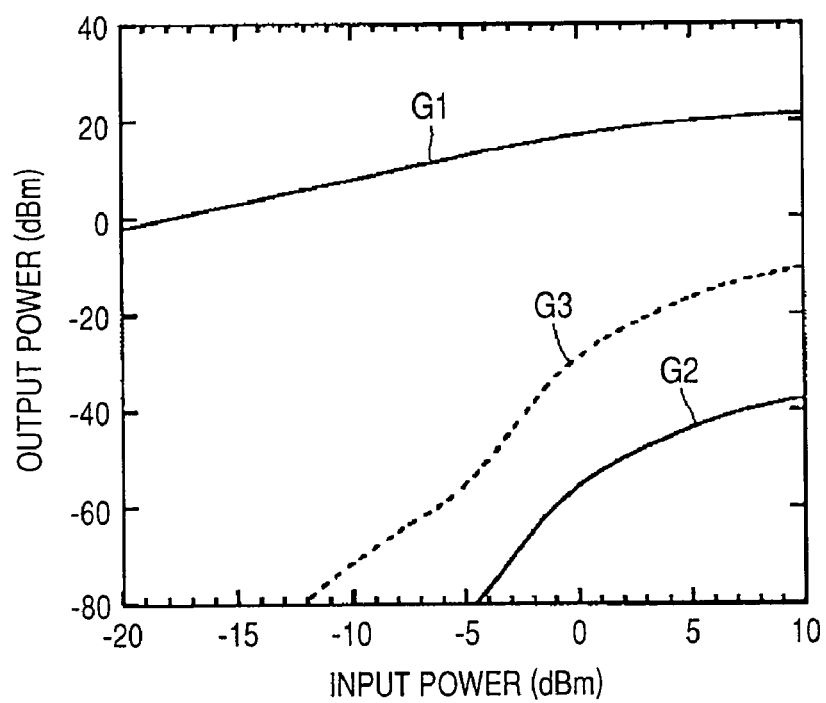
FIG. 4 is a diagram showing the input and output characteristics of the power amplifier according to the first embodiment of the present invention.

FIG. 4 is a diagram showing the input/output characteristics of the power amplifier according to the first embodiment of the present invention. FIG. 4 shows the calculation results of the output signal characteristics for the input signal of 2.4 GHz when the circuit constants of the circuit block that includes the transformer 20, the tertiary coil 23, and the capacitor 41 are used as they are and under the condition that equivalent circuit models are applied to the MOS type transistors 51a, 51b, 52a, and 52b shown in FIG. 2. In FIG. 4, graph G1 shows the output signal characteristics for the input signal of 2.4 GHz, which is a fundamental wave, and graph G2 shows the third harmonic signal characteristics for the input signal of 2.4 GHz. For comparison, there are shown by graph G3 the third harmonic signal characteristics for the input signal of 2.4 GHz in an assumed configuration that the power amplifier 101 does not include the tertiary coil 23 or the capacitor 41.

From the graphs G1 to G3, it can be seen that the third harmonic component is suppressed about 20 dB due to the LC resonance circuit including the tertiary coil 23 and the capacitor 41 in the power amplifier 101.

As a result, with the power amplifier according to the first embodiment of the present invention, it is possible to obtain the effect to suppress the high-order frequency distortion, that is, the third harmonics in the composite signal 3 output from the secondary coil 22. Consequently, the output characteristics are improved. Further, by arranging the tertiary coil 23 and the capacitor 41 inside the transformer 20, it is possible to prevent an increase in size of the power amplifier 101 without causing a substantial increase in the area of the semiconductor substrate B.

The power amplifier according to the first embodiment of the present invention is so configured that the primary coil 21, the secondary coil 22, and the tertiary coil 23 are substantially C-shaped, but is not limited to such a configuration. With any configuration in which a region (AR in FIG. 2) surrounded by the primary coil 21 and the secondary coil 22 along its entire circumference is formed and the tertiary coil 23 is provided in the region AR over the main surface of the semiconductor substrate B, it is possible to prevent an increase in size of the power amplifier 101.

Figure 5:
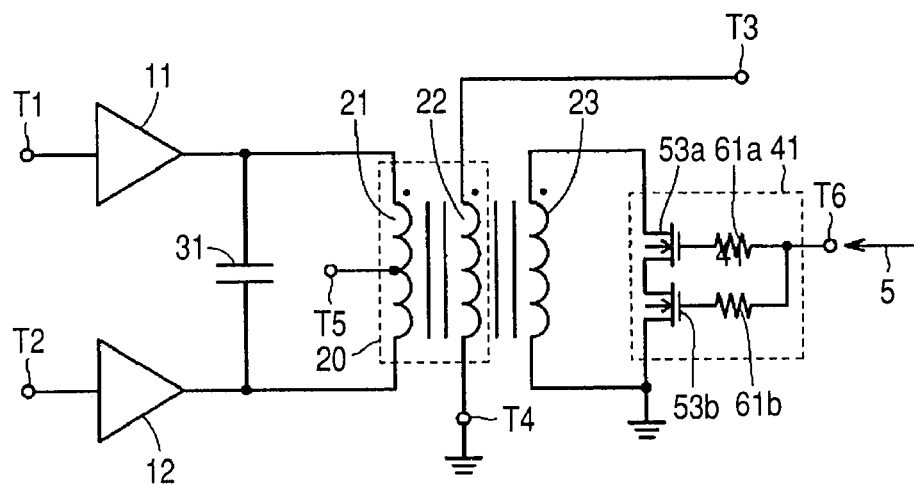
FIG. 5 is a diagram showing a configuration in which a MOS type transistor is applied to the capacitor 41 in the power amplifier according to the first embodiment of the present invention.

FIG. 5 is a diagram showing a configuration in which a MOS type transistor is applied to the capacitor 41 in the power amplifier according to the first embodiment of the present invention.

Referring to FIG. 5, a power amplifier 102 further includes a terminal T6 compared to the power amplifier 101. The capacitor 41 includes N-channel MOS type transistors 53a, 53b and gate resistors 61a, 61b.

The above-mentioned power amplifier 101 has a configuration in which the third harmonic component is suppressed by the tertiary coil 23 and the capacitor 41.

The drain of the MOS type transistor 53a and the drain of the MOS type transistor 53b are coupled. The sources of the MOS type transistors 53a, 53b and the first end and the second end of the tertiary coil 23 are coupled, respectively. The source of the MOS type transistor 53b is grounded. The gates of the MOS type transistors 53a, 53b are coupled to the terminal T6 via the gate resistors 61a, 61b. To the terminal T6, a control signal 5 is applied.

The control signal 5 is set to two DC voltages, for example, +3.3 V and −3.3 V. When the control signal 5 is set to the DC voltage of −3.3 V, the MOS type transistors 53a, 53b turn off, and therefore, the MOS type transistors 53a, 53b function as a capacitor. On the other hand, when the control signal 5 is set to the DC voltage of +3.3 V, the MOS type transistors 53a, 53b turn on, and therefore, they function as a resistor.

Figure 6:
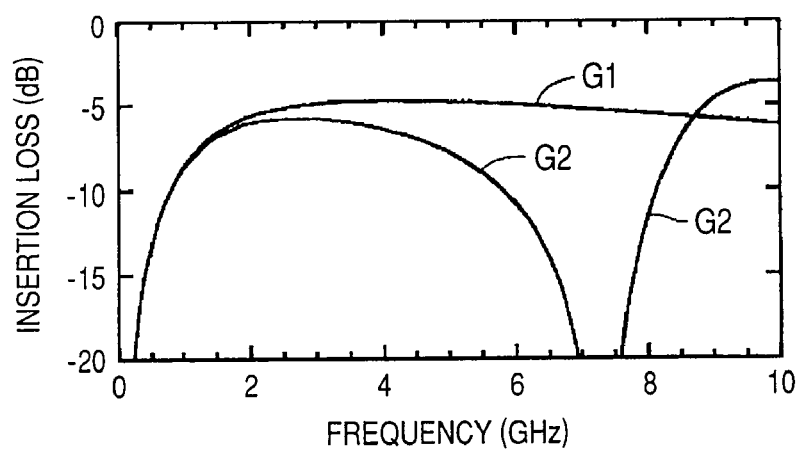
FIG. 6 is a diagram showing the calculation results of the insertion loss characteristics in a high frequency region of the circuit block including the transformer 20, the tertiary coil 23, and the capacitor 41 to be applied to a power amplifier 102 shown in FIG. 5.

FIG. 6 is a diagram showing the calculation results of the insertion loss characteristics in a high frequency region of the circuit block including the transformer 20, the tertiary coil 23, and the capacitor 41 to be applied to the power amplifier 102 shown in FIG. 5. In the calculation of the insertion loss characteristics shown in FIG. 6, the gate width of the MOS type transistors 53a, 53b is set to 2 mm and the R (resistance) value of the gate resistors 61a, 61b is set to 40 kO. Graph G1 shows a case where the control signal 5 is set to the DC voltage of +3.3 V and graph G2 shows a case where the control signal 5 is set to the DC voltage of −3.3 V. Other circuit constants are the same as those in the calculation of the insertion loss characteristics shown in FIG. 3.

From graph G2, it can be seen that substantially the same insertion loss characteristics in FIG. 3 are obtained when the control signal 5 is set to the DC voltage of −3.3 V.

On the other hand, from graph G1, when the control signal 5 is set to the DC voltage of +3.3 V, unlike the insertion loss characteristics shown in FIG. 3, the third harmonic component is not suppressed and the characteristics are substantially the same as those when the tertiary coil 23 is not provided. However, the insertion loss of the output signal of 2.4 GHz is about 0.6 dB smaller compared with the insertion loss characteristics shown in FIG. 3.

In general, in the power amplifier, when input power is smaller, the third harmonic component is smaller as can also be seen from FIG. 4.

As a result, in the power amplifier 102, when input power is smaller, it is possible to suppress the insertion loss of the output signal by setting the control signal 5 to the DC voltage of +3.3 V. On the other hand, when input power is larger, it is possible to suppress the third harmonic component by setting the control signal 5 to the DC voltage of −3.3 V.

Next, another embodiment of the present invention will be described using the drawings. In the drawings, the same symbols are assigned to the same parts or corresponding parts and their description is not repeated.

Second Embodiment

The present embodiment relates to a power amplifier in which a coil is added compared to the power amplifier according to the first embodiment. The contents except for those to be described below are the same as those in the power amplifier according to the first embodiment.

Figure 7:
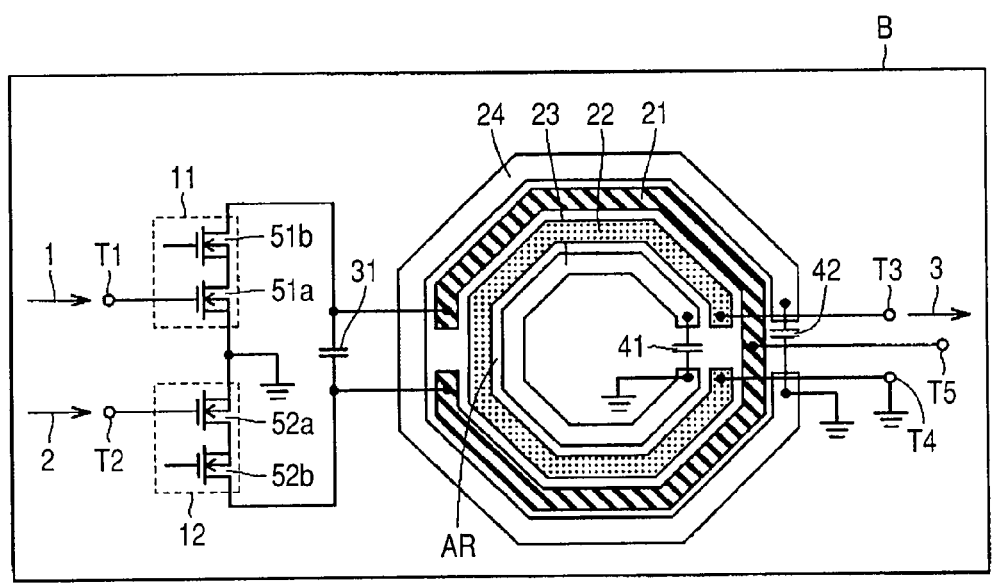
FIG. 7 is a diagram showing a schematic layout of each coil in a power amplifier according to a second embodiment of the present invention.

FIG. 7 is a diagram showing a schematic layout of each coil in the power amplifier according to a second embodiment of the present invention.

Referring to FIG. 7, a power amplifier 103 further includes a quaternary coil 24 and a capacitor 42, compared with the power amplifier according to the first embodiment of the present invention.

The quaternary coil 24 is located, for example, outside the primary coil 21. The quaternary coil 24 is formed using a wire layer over the main surface of the same semiconductor substrate B as the primary coil 21, the secondary coil 22, and the tertiary coil 23 are formed, and is substantially C-shaped. The capacitor 42 is coupled between both ends of the quaternary coil 24.

In more detail, the quaternary coil 24 is magnetically coupled with the primary coil 21 and has a first end coupled to a first end of the capacitor 42 and a second end coupled to a second end of the capacitor 42 and a ground node which is supplied with a ground voltage. The capacitor 42 is coupled between the first end and the second end of the quaternary coil 24.

The quaternary coil 24 is provided over the main surface of the semiconductor substrate B, extends in the circumferential direction so as to surround the primary coil 21 to the tertiary coil 23, and is formed by a conductive line which is opened at a partial section in the circumferential direction.

Figure 8:
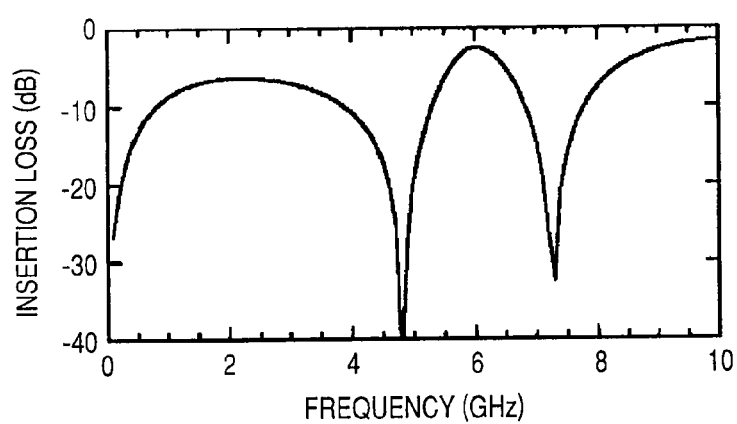
FIG. 8 is a diagram showing the calculation results of the insertion loss characteristics in a high frequency region of a circuit block including the transformer 20, the tertiary coil 23, a quaternary coil 24, the capacitor 41, and a capacitor 42 to be applied to the power amplifier according to the second embodiment of the present invention.

FIG. 8 is a diagram showing the calculation results of the insertion loss characteristics in a high frequency region of a circuit block including the transformer 20, the tertiary coil 23, the quaternary coil 24, the capacitor 41, and the capacitor 42 to be applied to the power amplifier according to the second embodiment of the present invention.

In the calculation of the insertion loss characteristics shown in FIG. 8, it is assumed that: the quaternary coil 24 is an ideal inductor and its L value is 2.6 nH; the magnetic coupling coefficient k value between the primary coil and the quaternary coil is 0.565; and the capacitor 42 is an ideal capacitor and its C value is 0.42 pF. Other circuit constants are the same as those in the calculation of the insertion loss characteristics shown in FIG. 3.

Referring to FIG. 8, when the frequency of the output signal of the power amplifier 103 is 2.4 GHz, an insertion loss of 30 dB is obtained at 7.2 GHz, that is, three times the frequency of the output signal. Further, when the frequency of the output signal of the power amplifier 103 is 2.4 GHz, an insertion loss of 40 dB is obtained at 4.8 GHz, twice the frequency of the output signal due to the quaternary coil 24 and the capacitor 42 newly added compared to the power amplifier 101. That is, in the power amplifier 103, it can be seen that the circuit block including the transformer 20, the tertiary coil 23, and the capacitor 41 has a function to suppress the frequency component of three times the frequency of the output signal, that is, 2.4 GHz, and further, the circuit block including the transformer 20, the quaternary coil 24, and the capacitor 42 has a function to suppress the frequency component of twice 2.4 GHz.

In the transformer type power amplifier of one differential pair, when the input signal 1 and the input signal 2 are ideal differential signals, the amplifier 11 and the amplifier 12 have exactly the same characteristics, and the primary coil 21, the secondary coil 22, the tertiary coil 23, and the quaternary coil 24 have a symmetric shape, the second harmonics do not appear in the output signal 3.

However, the amplifier 11 and the amplifier 12 include the MOS type transistor, and therefore, it is unlikely that they have exactly the same characteristics and each coil does not have a perfectly-symmetric shape.

Consequently, as in the power amplifier according to the second embodiment of the present invention, it is further effective to suppress the second harmonics securely by adding the quaternary coil 24 and the capacitor 42.

Other configurations and operations are the same as those in the power amplifier according to the first embodiment, and therefore, their detailed description is not repeated here.

Next, another embodiment of the present invention will be described using the drawings. In the drawings, the same symbols are assigned to the same parts or corresponding parts and their description is not repeated.

Third Embodiment

The present embodiment relates to a power amplifier that makes an attempt to further increase output compared to the power amplifier according to the first embodiment. The contents except for those to be described below are the same as those in the power amplifier according to the first embodiment.

Figure 9:
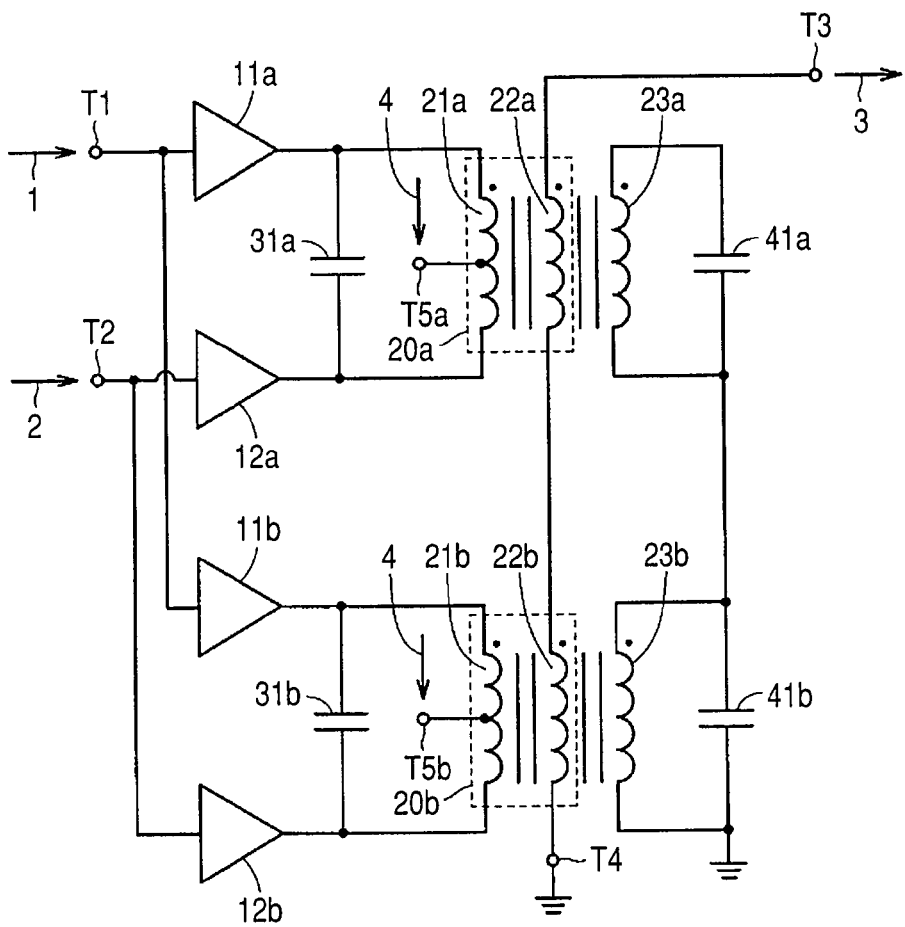
FIG. 9 is a diagram showing a schematic layout of each coil in a power amplifier according to a third embodiment of the present invention.

FIG. 9 is a diagram showing a schematic layout of each coil in the power amplifier according to a third embodiment of the present invention.

Referring to FIG. 9, a power amplifier 104 is a transformer type power amplifier of two differential pairs, comprising power amplifiers 11a and 12a, a transformer 20a, capacitors 31a and 41a, a tertiary coil 23a, power amplifiers 11b and 12b, a transformer 20b, capacitors 31b and 41b, a tertiary coil 23b, the terminals T1 to T4, and terminals T5a, T5b. The transformer 20a includes a primary coil 21a and a secondary coil 22a. The transformer 20b includes a primary coil 21b and a secondary coil 22b.

The amplifiers 11a and 12a, the transformer 20a, the capacitors 31a and 41a, the tertiary coil 23a, and the terminals T1 to T4, T5a correspond to the amplifiers 11 and 12, the transformer 20, the capacitors 31 and 41, the tertiary coil 23, and the terminals T1 to T4, T5, respectively, in the power amplifier according to the first embodiment of the present invention. Consequently, the contents that are the same as those of the power amplifier according to the first embodiment of the present invention are not described repeatedly in detail.

The amplifiers 11b and 12b amplify the input signal 1 and the input signal 2 received via the terminals T1 and T2, respectively.

The transformer 20b composites an output signal of the amplifier 11b and an output signal of the amplifier 12b. That is, the primary coil 21b has a first end that receives the input signal 1 amplified by the amplifier 11b and a second end that receives the input signal 2 amplified by the amplifier 12b. The terminal T5b is coupled to the middle point of the primary coil 21b and the power supply voltage 4 is supplied to the terminal 5b.

The capacitor 31b is coupled between the first end and the second end of the primary coil 21b. The primary coil 21b and the capacitor 31b constitute an output matching circuit of the amplifiers 11b and 12b.

The secondary coil 22b is magnetically coupled with the primary coil 21b and coupled with the coil 22a. A second end of the secondary coil 22b is grounded via the terminal T4 and the output signal 3 is taken out from a first end of the secondary coil 22a.

In more detail, the secondary coil 22a has a first end coupled to the terminal T3 and a second end coupled to a first end of the secondary coil 22b. The secondary coil 22b has the first end coupled to the second end of the secondary coil 22a and the second end coupled to the terminal T4. The output signal 3 of the power amplifier 104, that is, the composite signal 3 of the input signal 1 and the input signal 2 amplified by the amplifiers 11a and 12a, and the input signal 1 and the input signal 2 amplified by the amplifiers 11b and 12b is output from the terminal T3. The terminal T4 is coupled to a ground node to which a ground voltage is supplied.

The tertiary coil 23a and the capacitor 41a are coupled in parallel, and the tertiary coil 23b and the capacitor 41b are coupled in parallel. A parallel circuit including the tertiary coil 23a and the capacitor 41a and a parallel circuit including the tertiary coil 23b and the capacitor 41b are coupled in series.

In more detail, the tertiary coil 23a is magnetically coupled with the secondary coil 22a and has a first end coupled to a first end of the capacitor 41a and a second end coupled to a second end of the capacitor 41a and a first end of the tertiary coil 23b.

The tertiary coil 23b is magnetically coupled with the secondary coil 22b and has a first end coupled to a first end of the capacitor 41b and a second end coupled to a second end of the capacitor 41b and a ground node to which a ground voltage is supplied. The capacitor 41b is coupled between both ends of the coil 23b.

For example, the amplifiers 11a, 11b, 12a and 12b have the same configuration, the tertiary coil 23a and the tertiary coil 23b have the same L value, and the capacitor 41a and the capacitor 41b have different C values.

Figure 10:
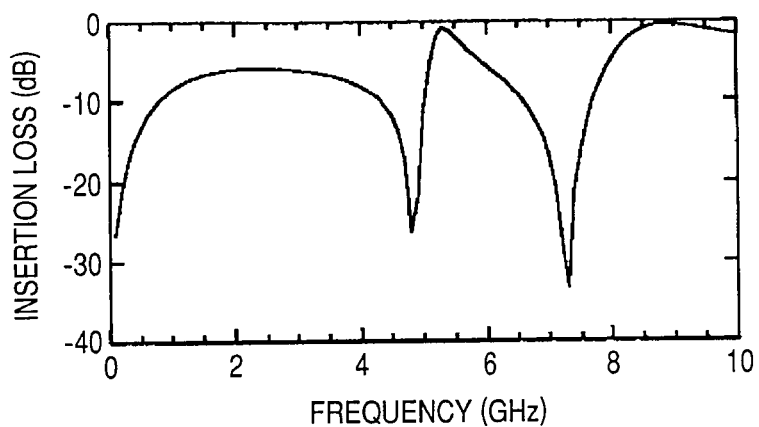
FIG. 10 is a diagram showing the calculation results of the insertion loss characteristics in a high frequency region of a circuit block including transformers 20a, 20b, tertiary coils 23a, 23b, and capacitors 41a, 41b to be applied to the power amplifier according to the third embodiment of the present invention.

FIG. 10 is a diagram showing the calculation results of the insertion loss characteristics in a high frequency region of a circuit block including the transformers 20a, 20b, the tertiary coils 23a, 23b, and the capacitors 41a, 41b to be applied to the power amplifier according to the third embodiment of the present invention.

In the calculation of the insertion loss characteristics shown in FIG. 10, it is assumed that: the primary coils 21a, 21b are ideal inductors and their L (inductance) value is 2.4 nH; the secondary coils 22a, 22b are ideal inductors and their L value is 2.2 nH; the tertiary coils 23a, 23b are ideal inductors and their L value is 2.0 nH; the magnetic coupling coefficient k value between the primary coil and the secondary coil is 0.565 and the magnetic coupling coefficient k value between the secondary coil and the tertiary coil is 0.565; and the capacitors 41a, 41b are ideal capacitors and their C (capacitance) values are 0.24 pF and 0.54 pF, respectively.

Referring to FIG. 10, when the frequency of the output signal of the power amplifier 104 is 2.4 GHz, an insertion loss of 30 dB is obtained at 7.2 GHz, that is, three times the frequency of the output signal and an insertion loss of 25 dB is obtained at 4.8 GHz, that is, twice the frequency thereof. That is, it can be seen that the power amplifier 104 has a function to suppress the frequency component of twice the frequency of the output signal, that is, 2.4 GHz, and the frequency component of three times the frequency of the output signal.

Consequently, with the power amplifier according to the third embodiment of the present invention, it is possible to obtain the effect to suppress the second harmonic distortion as well as suppressing the high-order frequency distortion, that is, the third harmonic distortion, and to make an attempt to increase output by compositing two pairs of differential signals.

The power amplifier according to the third embodiment of the present invention, in order to suppress the second harmonic distortion and the third harmonic distortion, obtains the resonance frequencies corresponding to those twice and three times the frequency of the output signal by setting the tertiary coils 23a, 23b to the same L value and setting the capacitors 41a, 41b to different C values, however, is not limited to such a configuration. It is also possible to obtain these resonance frequencies by setting the capacitors 41a, 41b to the same C value and setting the tertiary coils 23a, 23b to different L values.

Other configurations and operations are the same as those in the power amplifier according to the first embodiment, and therefore, their detailed description is not repeated here.

It should be considered that the embodiments disclosed as above are only examples in all points and are not limitative. The scope of the present invention is defined not by the above descriptions but by claims and it is intended that all modifications in the meaning and scope equivalent to claims are included.

What is claimed is:

1. A power amplifier comprising:
a first amplifier amplifying a first input signal and a second input signal, which are differential signals;
a first coil receiving the first input signal and the second input signal amplified by the first amplifier;
a second coil magnetically coupled with the first coil and outputting a composite signal of the amplified first input signal and second input signal;
a third coil magnetically coupled with the second coil;
a first capacitor coupled between both ends of the third coil; and
a semiconductor substrate;
wherein one end of the first capacitor is coupled to a ground node;
wherein the first coil and the second coil are provided over the main surface of the semiconductor substrate;
wherein over the main surface of the semiconductor substrate, there is formed a region with its entire circumference surrounded by the first coil and the second coil; and
wherein the third coil is provided in the region.

2. A power amplifier comprising:
a first amplifier amplifying a first input signal and a second input signal, which are differential signals;
a first coil receiving the first input signal and the second input signal amplified by the first amplifier;
a second coil magnetically coupled with the first coil and outputting a composite signal of the amplified first input signal and second input signal;
a third coil magnetically coupled with the second coil; and
a first capacitor coupled between both ends of the third coil,
wherein one end of the first capacitor is coupled to a ground node; and
wherein the first capacitor includes:
a first transistor having a first conductive electrode coupled to a first end of the third coil, a second conductive electrode, and a control electrode; and
a second transistor having a first conductive electrode coupled to a second end of the third coil, a second conductive electrode coupled to the second conductive electrode of the first transistor, and a control electrode coupled to the control electrode of the first transistor.

3. A power amplifier comprising:
a first amplifier amplifying a first input signal and a second input signal, which are differential signals;
a first coil receiving the first input signal and the second input signal amplified by the first amplifier;
a second coil magnetically coupled with the first coil and outputting a composite signal of the amplified first input signal and second input signal;
a third coil magnetically coupled with the second coil;
a first capacitor coupled between both ends of the third coil,
a fourth coil magnetically coupled with the first coil; and
a second capacitor coupled between both ends of the fourth coil;
wherein one end of the first capacitor is coupled to a ground node; and
wherein one end of the second capacitor is coupled to a ground node.

4. The power amplifier according to claim 3, further comprising a semiconductor substrate,
wherein the first coil and the second coil are provided over the main surface of the semiconductor substrate;
wherein over the main surface of the semiconductor substrate, there is formed a region with its entire circumference surrounded by the first coil and the second coil;
wherein the third coil is provided in the region; and
wherein the fourth coil is provided over the main surface of the semiconductor substrate so as to surround the first coil and the second coil.

5. A power amplifier comprising:
a first amplifier amplifying a first input signal and a second input signal, which are differential signals;
a first coil receiving the first input signal and the second input signal amplified by the first amplifier;
a second coil magnetically coupled with the first coil and outputting a composite signal of the amplified first input signal and second input signal;
a third coil magnetically coupled with the second coil;
a first capacitor coupled between both ends of the third coil;

a second amplifier amplifying the first input signal and the second input signal;

a fifth coil receiving the first input signal and the second input signal amplified by the second amplifier;

a sixth coil magnetically coupled with the fifth coil and coupled with one end of the second coil;

a seventh coil magnetically coupled with the sixth coil and coupled with one end of the third coil; and a third capacitor coupled between both ends of the seventh coil;

wherein one end of the first capacitor is coupled to a ground node; and wherein a composite signal of the first input signal and the second input signal amplified by the first and second is output from the sixth coil.

* * * * *